Nov. 8, 1966 H. B. NOTTAGE ET AL 3,284,245

THERMOELECTRIC GENERATORS

Filed April 10, 1961 3 Sheets-Sheet 1

INVENTORS
HERBERT B. NOTTAGE
PAUL L. WINSKELL

By George C. Sullivan
Agent

INVENTORS
HERBERT B. NOTTAGE
PAUL L. WINSKELL
By
Agent

Nov. 8, 1966 H. B. NOTTAGE ET AL 3,284,245

THERMOELECTRIC GENERATORS

Filed April 10, 1961

3 Sheets-Sheet 3

INVENTORS
HERBERT B. NOTTAGE
PAUL L. WINSKELL

By [signature]
Agent 3,284,245
Patented Nov. 8, 1966

3,284,245
THERMOELECTRIC GENERATORS

Herbert B. Nottage, Encino, and Paul L. Winskell, Burbank, Calif., assignors to Lockheed Aircraft Corporation, Burbank, Calif.

Filed Apr. 10, 1961, Ser. No. 101,832
15 Claims. (Cl. 136—212)

This invention relates to thermoelectric devices and more particularly to thermoelectric generators for producing electric current or for heating and cooling.

If the junctions of dissimilar metals are subjected respectively to different temperatures, an electric current will be generated. Also with semiconductors, thermoelectric junctions can be formed where p-type and n-type materials meet, using "p" and "n" to designate the different materials. On the other hand, if electric current is passed through the junction of two dissimilar metals, heat is evolved (in addition to the $i^2r$ loss due to the resistance) when the current passes in one direction and heat is absorbed when the current passes in the other direction.

Furthermore, junctions of dissimilar materials, whether thermoelectric or the semiconductor type, have been series connected which obviously increases the voltage capabilities of the series relative to individual junctions, and thereby provides more practical power availability.

In recognition of the foregoing fundamentals various methods of forming thermoelectric devices have been devised, resulting in various configurations of the junctions utilizing conductors, semiconductors and thermoelectric materials.

The present invention, while recognizing the foregoing fundamentals, represents a departure from established concepts of thermoelectricity thereby permitting an expansion into a wider field of application. Prior devices and methods are referenced to and limited by the physical principle that the speed of a thermal wave through a conductor is very much lower than the speed of a corresponding electrical wave. This characteristic, while serving a useful function in some applications, imposes a definite limitation on alternating current thermoelectric generators or upon D.-C. thermoelectric generators which are desired to have a very rapid response rate to likewise rapid changes in junction temperature.

The ability of a thermoelectric generator to respond rapidly to thermal input excitation is achieved in the present invention by: (1) a thermoelectric junction with very low thermal capacitance, (2) a low resistance for heat transfer between the thermal source and the thermoelectric junction, and (3) high resistance for any thermal "leakage" flow away from the thermoelectric junction.

A primary object of the present invention is to provide a thermoelectric generator for high frequency alternating currents.

Another object of the invention is to provide a thermoelectric junction having a very low thermal capacitance.

A further object of the invention is to provide a thermoelectric assembly having physical characteristics which permit conformance to any reasonable surface curvature.

An additional object of the invention is to provide a thermo-electric assembly with a very small time constant and which thereby can act as a sensor for high-rate-of-change heat flows.

The above and other related objects will become more apparent from the following detailed description and with reference to the accompanying drawings in which FIGURE 1 is a composite view of a series junction ribbon of a preferred form for use in the present invention;

Figures 1, 1A:
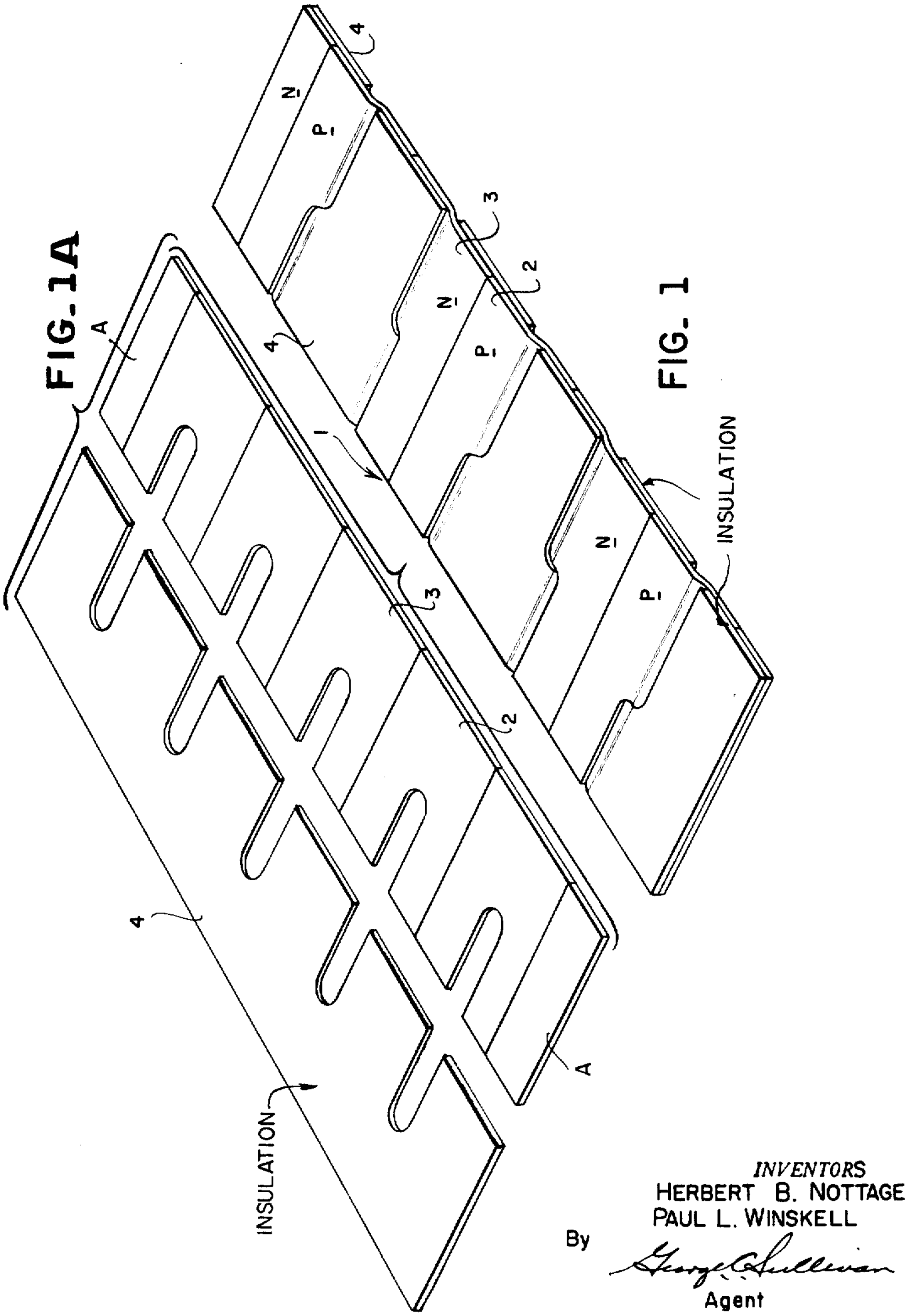
FIGURE 1A is an exploded view illustrating the separate elements of FIGURE 1.

With reference to FIGURE 1, a thermoelectric strip 1 is seen to be comprised of a series of P and N material 2 and 3, with an interwoven strip of insulation material 4. Cutouts as best seen in FIG. 1A permit interweaving of the two strips to form the assembled unit as shown in FIG. 1. It will be noted that the alternate junctions are exposed on one side of the strip and the in between junctions are exposed on the other side. If the top side in FIGURE 1 or the P–N junction is exposed to heat and the other side of the strip or the N–P junction is maintained at the ambient temperature, current will flow in one direction, whereas if the opposite side is heated, etc., current will flow in the opposite direction. Electrical connection may be made at the ends, as at A.

While ribbons of semiconductor-type thermoelectric materials have been illustrated, it should be apparent that the ribbons may be made by joining of any pair of thermoelectric materials.

Figures 2, 2A:
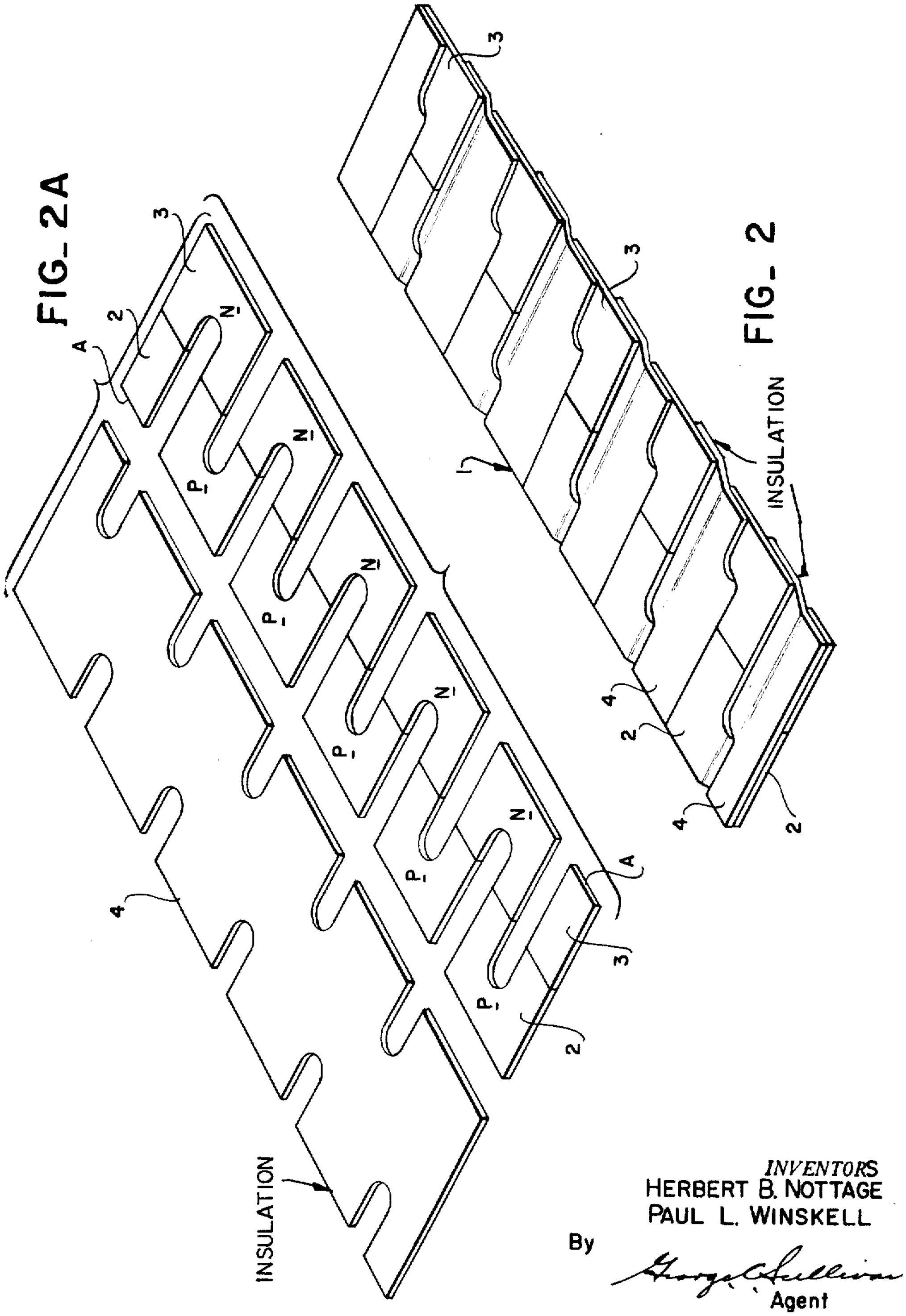
FIGURE 2 is a composite view of a modified form of a series junction ribbon which may be used in the present invention.
FIGURE 2A is an exploded view illustrating the separate elements of FIGURE 2.

In FIGURE 2, the thermoelectric junctions run lengthwise of the ribbon instead of across as in FIGURE 1. A strip of N material 3 and a strip of P material 2 are joined as shown and then cutouts are made on alternate sides of the combined strips as indicated in FIG. 2A. The strip of insulation material 4 is provided with cutouts on alternate sides which match the cutouts on the strip of semiconductor or other thermoelectric material so that the two strips may be interwoven as shown in the assembled unit to the right in FIGURE 2. It will be noted that in FIGURE 2 the cutouts place the junctions electrically in series. As in FIGURE 1, the alternate junctions are covered by the insulating material and if a heat source is applied to one side of the strip, only every other junction is subjected to the source of heat. In other words, the junctions which are unexposed on the one side are exposed on the other side.

The strips of thermoelectric junctions as shown in FIGURES 1 and 2 may be formed by selectively diffusing different impurities into the semiconductor material over adjacent areas. The junctions also may be formed by welding of thin bars of the different materials and then rolling into a ribbon.

Figures 3, 4, 6:
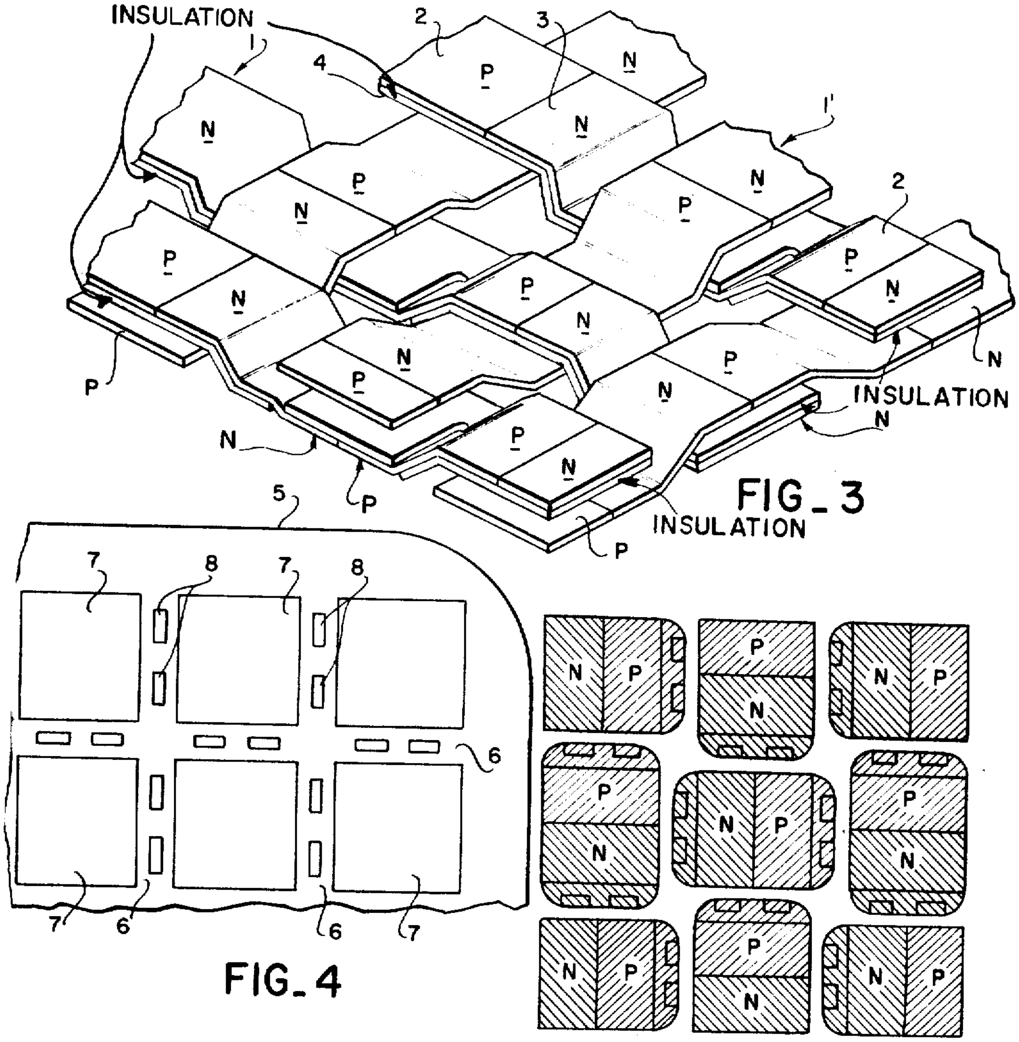
FIGURE 3 is a partial perspective of an assembly of thermoplastic elements demonstrating the present invention and wherein the relative dimensions and spacings are exaggerated for purposes of clarity.
FIGURES 4 and 5 are construction figures depicting steps leading to the final assembly form, FIGURE 6.
FIGURE 6 is a modified form of the assembly depicted in FIGURE 3.

In order to increase the number of junctions exposed to the heat source and thereby increase the over-all efficiency, a plurality of the ribbon strip assemblies of, say, FIGURE 1, may be interwoven, as in FIGURE 3, to form a web-like structure. As indicated the resulting assembly provides a "blanket" or "mat" which has a substantially increased area which is exposed to the temperature differential for current generation.

The strips 1 and 1', FIGURE 1, are interwoven, as shown in FIGURE 3, so that the P-N junction 2–3 of one strip overlies and contacts the insulating portion 4 of the other strip. This is to prevent the junction of one strip from interfering with an adjacent junction on the other strip. The insulation or lack of interference may also be provided where the strip 1', for example, is a plane ribbon of junctions without the interwoven insulating strip and positioned as shown in FIGURE 3.

Figure 5:
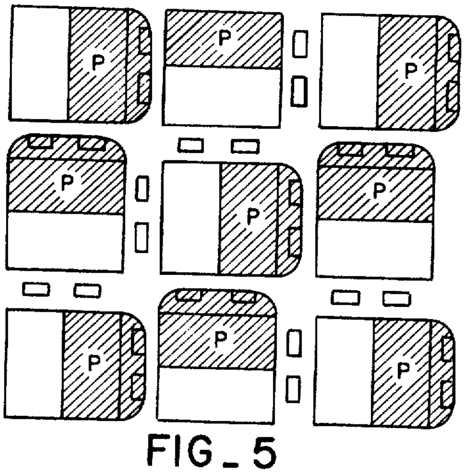

The interwoven assembly as illustrated in FIGURE 3 may also be accomplished by suitable printed circuit processes. Construction steps leading to typical "woven" assembly employing printed circuit technique are illustrated in FIGURES 4 and 5. The completed assembly is shown in FIGURE 6. Such a construction further allows the thickness of the thermoelectric material to be decreased, and thus decreases the thermal capacitance associated with a thermoelectric junction and thereby achieves an enhanced response to higher frequencies than would be obtainable with the ribbon-type of construction where mechanical strength requirements could require a greater thickness of the thermoelectric material.

An insulation sheet 5 has printed grid lines 6 to facilitate and guide the semiconductor deposition process. The grid lines are applied to both sides of the sheet and form a plurality of areas 7 which are in register with like areas on the other side of the sheet 5. Slots 8 are cut into the grid and between adjacent sides of the areas 7 as shown and form a conductive path between elements on one side of the sheet and the other side.

Utilizing known techniques or variations thereof the "P" and "N" type semiconductor materials are consecutively deposited on both surfaces of the sheet 5 and into the slot areas as illustrated in FIGURES 5 and 6. Thus, the "P" type material will, for example, cover one-half of an area 7 on one side of the sheet, the adjacent slots and continuing through the slots to the other side of the sheet, the adjacent half of an area 7 on the other side of the sheet. Thus, the areas 7 are divided in rows and columns, wherein the conductive path weaves from one side of the sheet 5 to the other. In this manner, alternate junctions are exposed on each side of the sheet, in a manner similar to FIGURE 3, and establishes the requirements for thermoelectric elements that one junction be at a different temperature than the other.

With the weave-like construction of FIGURES 3 and 6, it is apparent that one side of the sheet may be exposed to a different temperature than the other and thus operates as a current generator. By alternating or rotating the sheet so that alternate sides are exposed to the heat source an alternating current generator is provided. On the other hand, if current is applied to the junctions, one side of the sheet will be cooler than the other, making this modification suitable for a compact airconditioning unit. Assemblies of this sort can be made to follow any reasonable surface curvature and may be bonded directly to any solid surface. Electrical connections between the strips may be made at the ends in any desired circuit pattern. It is to be understood that the terms "weave-like" and "woven-like" when used herein and in the claims are intended to mean both of the "weave-like" constructions of FIGURES 3 and 6.

While specific embodiments of the invention have been shown and described, it should be understood that certain alterations, modifications and substitutions may be made to the instant disclosure without departing from the spirit and scope of the invention as defined by the appended claims.

We claim:

1. A theremoelectric device comprising a plurality of thermoelectric elements which are joined together to form a ribbon of a continuous series of thermoelectric junctions, said ribbon having a plurality of cutouts in at least one side thereof, a strip of insulating material having a plurality of cutouts in said insulating material complementary to the cutouts in said ribbon, said ribbon and said insulating material being interwoven by means of the cutouts to provide exposure of the alternate junctions only of said ribbon on one side of said insulating material.

2. The device of claim 1 in which the junctions are formed by a plurality of thermoelectric elements joined side by side along the ribbon and in which the junctions lie transverse to the length of the ribbon.

3. The device of claim 1 in which the junctions are formed by a pair of long thin theremoelectric strips joined along their lengths to form a ribbon, said ribbon having cutouts along either side thereof and alternating and extending through the joint, an insulating strip having complementary cutouts interwoven into the cutouts of said ribbon to provide a series of thermoelectric junctions alternately exposed on one side of said ribbon.

4. The device of claim 2 in which the thermoelectric junctions consist of alternate P and N type materials.

5. The device of claim 2 in which the junctions consist of alternate dissimilar materials.

6. A thermoelectric unit comprising at least two unlike materials forming a continuous ribbon of alternate areas of said materials bonded therebetween to provide a series of thermoelectric junctions, said ribbon having cutouts in said areas on at least one side thereof and between said junctions, a strip of insulating material having cutouts complementary to the cutouts in said ribbon and interwoven with said ribbon in such manner that the insulation exposes alternate thermoelectric junctions and covers the inbetween junctions and means for connecting the unit to an external circuit.

7. In a thermoelectric generator a first plurality of conductive paths of series connected thermoelectric junctions having insulation covering alternate junctions, a second plurality of conductive paths of series connected thermoelectric junctions alternating above and below said first plurality of conductive paths and substantially perpendicular thereto, said first plurality and said second plurality lying in substantially the same plane, a thermoelectric junction of said first plurality overlying a thermoelectric junction of said second plurality, said insulation preventing electrical contact between said first and second plurality of conductive paths, whereby alternate junctions for each direction are exposed on one side of the woven-like assembly and the same junction is covered on the other side.

8. A thermoelectric generator as defined by claim 7 wherein said conductive paths of series connected thermoelectric elements are pairs of P and N type semiconductor materials and the insulating material is a thin insulating sheet upon which the pairs of P and N materials are deposited.

9. A thermoelectric device comprising an insulating sheet, a plurality of uniform areas on each side of said sheets, said sheets having slots extending therethrough between each said area and the adjacent area, pairs of P–N type material defining a thermoelectric junction upon each uniform area on each side of said sheet, each junction normal to the junction of an adjacent pair of P–N materials and normal to the junction on the other side of said sheet, means including said slots for connecting each P-type material of a pair on one side of the sheet to a P-type material of a pair on the other side said pairs having their junctions in parallel relation, whereby said pairs are series connected in rows and columns of thermoelectric junctions with alternate junctions on one side of said sheet and the inbetween junctions on the other side of said sheet.

10. A thermoelectric device comprising a first plurality of series connected thermoelectric junctions, a second plurality of series connected thermoelectric junctions, said second plurality lying in a plane parallel to and normal to said first plurality, the series of said first plurality alternating above and below with the series of said second plurality, insulation means between the junctions of one plurality and the junction of the other plurality at the point of overlapping.

11. A thermoelectric unit comprising a first plurality of parallel arranged conductive paths of series connected thermoelectric junctions, a second plurality of parallel arranged conductive paths of series connected thermoelectric junctions, said second plurality of conductive paths lying perpendicular to said first plurality of conductive paths and alternating above and below therewith each strip consisting of a series of thermoelectric junctions having alternate junctions on each side of the conductive paths covered by insulating material, said insulating material separating the junctions of the first plurality from the junctions of the second plurality.

12. The unit as defined by claim 11, further including means for providing a temperature differential to the two sides of the unit and means for connecting the conductive paths in an electrical circuit.

13. The unit as defined by claim 11, further including means for energizing said conductive paths with an electrical current.

14. A thermoelectric generator comprising a first series of thermoelectric junctions defining a current path therethrough, means including a second series of thermoelectric junctions arranged perpendicularly to said first series insulatingly covering alternate junctions of each series, said first and second series of junctions lying in at least parallel planes whereby exposure of the uncovered junctions to a temperature different from the temperature of the covered junction causes an electric current to flow.

15. A thermoelectric generator comprising a "woven-like" assembly of a first plurality of series connected thermoelectric junctions defining a current path therethrough, a second plurality of series connected thermoelectric junctions defining a current path therethrough, said first plurality and said second plurality being disposed at substantially right angles to each other, and having alternate junctions in each plurality crossing over alternate junctions of the other plurality, with the in-between junctions in each plurality crossing under the in-between junctions of the other plurality, and insulation means between the junctions of one plurality and the junctions of the other plurality at the points of overlapping.

References Cited by the Examiner

UNITED STATES PATENTS

| | | | |
|---|---|---|---|
| 1,528,383 | 3/1925 | Schmidt | 136—5.1 |
| 1,638,943 | 8/1927 | Little | 136—5.22 |
| 1,667,142 | 4/1928 | Darrah | 136—5.22 |
| 2,381,819 | 8/1945 | Graves et al. | 136—5.22 |
| 2,519,785 | 8/1950 | Okolicsanyi | 136—4 |

WINSTON A. DOUGLAS, *Primary Examiner.*

JOHN H. MACK, ALLEN B. CURTIS, *Examiners.*

J. BARNEY, D. L. WALTON, *Assistant Examiners.*